United States Statutory Invention Registration [19]

[11] Reg. Number: H952

Gualtieri

[43] Published: Aug. 6, 1991

[54] METHOD OF PREPARING A QUARTZ SURFACE FOR SWEEPING

[75] Inventor: John G. Gualtieri, Oceanport, N.J.

[73] Assignee: The United States of America as represented by the Secretary of the Army, Washington, D.C.

[21] Appl. No.: 405,822

[22] Filed: Sep. 11, 1989

[51] Int. Cl.[5] ..... G03C 5/00

[52] U.S. Cl. ..... 430/313; 430/314; 430/315; 430/312; 430/319; 430/320; 430/321

[58] Field of Search ..... 430/319, 320, 321, 312, 430/313, 314, 315

[56] References Cited

U.S. PATENT DOCUMENTS

| | | | |
|---|---|---|---|
| 3,949,463 | 4/1976 | Lindmayer et al. | 430/315 |
| 4,151,492 | 4/1979 | Sandy et al. | 333/191 |
| 4,839,618 | 6/1989 | Roberts et al. | 333/189 |

*Primary Examiner*—Robert L. Stoll
*Assistant Examiner*—Cynthia Harris
*Attorney, Agent, or Firm*—Michael Zelenka; Roy E. Gordon

[57] ABSTRACT

A quartz surface is prepared for sweeping by a method including the steps of:

(A) cleaning the quartz surface, (B) depositing a metal electrode onto the cleaned quartz surface, and (C) creating periodic openings in the metal electrode in such a manner that the metal is not disconnected by the arrangement of openings and all the metal is at one potential.

9 Claims, No Drawings

A statutory invention registration is not a patent. It has the defensive attributes of a patent but does not have the enforceable attributes of a patent. No article or advertisement or, the like may use the term patent, or any term suggestive of a patent, when referring to a statutory invention registration. For more specific information on the rights associated with a statutory invention registration see 35 U.S.C. 157.

METHOD OF PREPARING A QUARTZ SURFACE FOR SWEEPING

The invention described herein may be manufactured, used and licensed by or for the Government for governmental purposes without the payment to me of any royalty thereon.

This invention relates in general to a method of treating a quartz surface and in particular to a method of preparing a quartz surface for sweeping.

BACKGROUND OF THE INVENTION

Quartz is swept generally to render it largely insensitive to radiation. Sweeping generally involves subjecting a quartz crystal in air to an electric field of at least 250V/cm at a temperature of at least 400° C. for a period of at least 12 hours. Such air-swept quartz in resonators commonly yields frequency offsets of no greater than 0.1 ppm after a cumulative exposure of $10^6$ to $10^7$ rad.

Sweeping only occurs when there is good electrical contact between the quartz and a metallic electrode. Many methods have been tried to improve the contact. For example, one method has been to sputter or evaporate the metal onto the quartz surface. This improves the contact, but if the metal is too strongly adherent, then hydrogen species including $H_2$, $H^+$, and $H_2O$ cannot diffuse interfacially fast enough to cover the entire surface between the quartz and the metallic electrode. On the other hand, if the metal is weakly adherent, then metal recession results in loss of electrode contact during the prolonged sweeping times at high temperatures.

SUMMARY OF THE INVENTION

The general object of this invention is to provide a method of treating a quartz surface. A more particular object of the invention is to provide a method of preparing a quartz surface for sweeping wherein there will be a good electrical contact between the quartz surface and a metallic electrode. A still further object of the invention is to provide a method of preparing quartz for sweeping wherein the quartz will be homogeneously swept assuring production of resonators with predictable performance.

It has now been found that the aforementioned objects can be attained by a method including the steps of:

(A) cleaning the quartz surface, (B) depositing a metal electrode onto the cleaned quartz surface, and (C) creating periodic openings in the metal electrode in such a manner that the metal electrode is not disconnected by the arrangement of the openings and all the metal is at one potential.

The periodic openings created in the electrode insure that hydrogen species $H_2$, $H^+$ and $H_2O$ will be present at three phase points between electrode, quartz, and atmosphere and will spread interfacially to two phase points between the electrode and quartz. The periodic openings, either in stripe form or dot matrix or other geometric arrangement can be made by photolithography, photolithographic etching, or lasing machining.

The quartz material being prepared for sweeping can have different sizes, shapes, and dimensions. For example, there can be Y-bars, SC-bars, AT-cut and SC-cut resonator blanks, etc. Since, apparently 1 mm of material should be removed from the cathode side of the swept piece, the thickness of the piece to be swept should be adjusted in order to produce the required final dimensions of finished resonator blanks.

The quartz surface used is first cleaned using conventional cleaning techniques such as trichloroethane, hot detergent, alcohol, and distilled water. As a final step, samples are cleaned in an oxygen plasma for 2 minutes.

A metal electrode is then deposited on the cleaned quartz surface by first depositing a strongly adherent metal as a base, followed by a mixture of the base metal with a surface metal followed by the deposition of the surface metal alone. A very desirable metal electrode can be formed using chromium as the base or strongly adherent metal and gold as the surface metal. More particularly, the metal electrode can be formed by first depositing by sputtering or evaporation deposition about 100 angstroms of chromium followed by about 50 angstroms of a mixture of chromium and gold followed by about 1000 angstroms of gold. In lieu of chromium and gold, one might use vanadium, aluminum, hafnium, zirconium, titanium or niobium as the strongly adherent base film and either platinum, nickel, copper, manganese or cobalt as the surface film.

Periodic openings are then created intentionally within an electroded surface of the quartz sample to be swept. The openings or holes should be spaced such that the surface density of openings assures complete coverage of the surface through the interfacial diffusional spread of H-species. In short, any geometrical design that creates openings in the metal electrode will suffice. The metal should not be disconnected by the arrangement of openings, that is, all the metal should be at one potential. In this connection, unintentional electrode openings are referred to as porous films. If porosity is insufficient, color centers will form. If porosity is extensive, loss of electrical contact can result. Intentional opening designs will maintain physical and electrical contact and allow penetration of atmospheric water vapor at 3-phase points (electrode-quartz-atmosphere) and interfacial diffusion to 2-phase points for the purpose of electrochemical conversion of $H_2O$ and $H_2$ into protons ($H^+$). The proton entry sites will probably be at dislocation and damaged regions on the quartz surface.

The invention will insure that a quartz surface will be air-swept homogeneously, that is, alkali-metal compensators for A1 impurities will be replaced by $H^+$, eliminating or drastically reducing any non-uniformity of Q or radiation sensitivity created by the formation of competing hole-compensated aluminum impurities.

DESCRIPTION OF THE PREFERRED EMBODIMENT

A quartz y-bar is cleaned and its Z surfaces electroded by evaporating, first 100 Å of Cr, then 50 Å Cr/Au mixture followed by 1000 Å of Au. Periodic openings are then created in the electrodes using a photolithographic etching or lift-off technique.

On subsequent sweeping, the samples exhibit a uniformity of replacement of alkali compensators (for A1 impurities) with protons resulting in Al-OH centers. Infrared absorption spectroscopy reveals a uniform increase of the room temperature A1-OH band at 3378 $cm^{-1}$ with respect to spatial variations of an IR analysis beam propagating in the X-direction. There is no indication of color-center striae in the Z-direction. Color-center striae are an indication that sweeping has proceeded nonuniformly. Color centers are created when $H^+$ is unavailable at the anode for entry into the quartz by electrochemical processes. This unavailability will occur if thick strongly adherent metallizations are applied. Openings in the metallization avoids this occurrence. Strongly adherent films result from the formation of metal silicides when metals react with the $SiO_2$ surface. These strongly adherent films are required to insure that the electrode is not removed in subsequent handling, cleaning, or during the sweeping process itself which causes metal recession. The formation of metal silicides in the metal quartz interface inhibits the interfacial diffusion of H-species. Electrode films containing openings insure that H-species can be introduced at three-phase points or points where the atmosphere, electrode and quartz meet. From these linear regions, H-species diffuse interfacially to entry points in the quartz for sweeping the interfacial diffusivity in the case of chromium on quartz has been determined to be $7\times10^{-9}$ $cm^2/sec$, with the H-diffusant being drained into the quartz for volume diffusion or sweeping. Stripes running in any direction is the preferred geometry as openings are created such that H-species can diffuse interfacially from each of the openings. If the metal stripe width is less than 2 times the diffusion length for the isothermal sweeping period, it will be assured that H-species will diffuse over the entire quartz surface. The open-quartz stripe width should be kept under 0.5 mm as it has been found that H can be introduced in regions as close as 0.5 mm to an anode boundary. In the case of chromium and a 36 hour maximum temperature sweeping time, the metal stripe width is made to be $<2$ times the mean free diffusional path $\times=(Dt)^{\frac{1}{2}}$.

I wish it to be understood that I do not desire to be limited to the exact details of construction shown and described for obvious modifications will occur to a person skilled in the art.

What is claimed is:

1. Method of preparing a quartz surface for sweeping, said method including the steps of:

(A) cleaning the quartz surface, (B) depositing a metal electrode onto the cleaned quartz surface, and (C) creating periodic openings in the metal electrode in such a manner that the metal electrode is not disconnected by the arrangement of the openings and all the metal is at one potential, and so that H species including $H_2$, $H^+$ and $H_2O$ between the metal and the quartz, from each of the openings.

2. Method according to claim 1 wherein the metal electrode is formed by first depositing a strongly adherent metal as a base followed by a mixture of the base metal with a surface metal followed by the surface metal.

3. Method according to claim 2 wherein the metal electrode is formed by first depositing about 100 angstroms of chromium as the base followed by about 50 angstroms of a chromium-gold mixture followed by about 1000 angstroms of gold.

4. Method according to claim 1 wherein the periodic openings are created in the metal electrodes through the use of a method selected from the group consisting of photolithographic lift off, photolithographic etching, and laser machining.

5. Method according to claim 4 wherein the method used is photolithographic lift off.

6. Method according to claim 4 wherein the method used is photolithographic etching.

7. Method according to claim 4 wherein the method used is laser machining.

8. Method according to claim 1 wherein the openings are created in a stripe arrangement.

9. Method according to claim 1 wherein the openings are created in a dot-matrix arrangement.

* * * * *